(12) United States Patent
Weeks et al.

(10) Patent No.: US 11,302,823 B2
(45) Date of Patent: Apr. 12, 2022

(54) METHOD FOR MAKING SEMICONDUCTOR DEVICE INCLUDING A SUPERLATTICE WITH DIFFERENT NON-SEMICONDUCTOR MATERIAL MONOLAYERS

(71) Applicant: Atomera Incorporated, Los Gatos, CA (US)

(72) Inventors: Keith Doran Weeks, Chandler, AZ (US); Nyles Wynn Cody, Tempe, AZ (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 16/801,287

(22) Filed: Feb. 26, 2020

(65) Prior Publication Data

US 2021/0265509 A1 Aug. 26, 2021

(51) Int. Cl.
H01L 29/786 (2006.01)

(52) U.S. Cl.
CPC .. *H01L 29/78687* (2013.01); *H01L 29/78654* (2013.01)

(58) Field of Classification Search
CPC .............. H01L 29/78687; H01L 29/78654
See application file for complete search history.

(56) References Cited

U.S. PATENT DOCUMENTS

| 4,937,204 A | 6/1990 | Ishibashi et al. |
| 4,945,394 A | 7/1990 | Palmour et al. |
| 5,216,262 A | 6/1993 | Tsu |
| 5,357,119 A | 10/1994 | Wang et al. |
| 5,683,934 A | 11/1997 | Candelaria |
| 5,796,119 A | 8/1998 | Seabaugh |
| 6,141,361 A | 10/2000 | Mears et al. |

(Continued)

FOREIGN PATENT DOCUMENTS

GB 2347520 6/2000

OTHER PUBLICATIONS

Lanzerotti et al., "Suppression of Boron Transient Enhanced Diffusion in SiGe Heterojunction Bipolar Transistors by Carbon Incorporation," Appl. Phys. Lett. 70 (23), Jun. 9, 1997, pp. 3125-3127.

(Continued)

*Primary Examiner* — Edward Chin
(74) *Attorney, Agent, or Firm* — Allen, Dyer, Doppelt + Gilchrist, P.A. Attorneys at Law

(57) ABSTRACT

A method for making a semiconductor device may include forming a superlattice on a semiconductor substrate and including a plurality of stacked groups of layers. Each group of layers of the superlattice may include a plurality of stacked base semiconductor monolayers defining a base semiconductor portion and at least one non-semiconductor monolayer constrained within a crystal lattice of adjacent base semiconductor portions. A first at least one non-semiconductor monolayer may be constrained within the crystal lattice of a first pair of adjacent base semiconductor portions and comprise a first non-semiconductor material, and a second at least one non-semiconductor monolayer may be constrained within the crystal lattice of a second pair of adjacent base semiconductor portions and comprise a second non-semiconductor material different than the first non-semiconductor material.

21 Claims, 13 Drawing Sheets

(56) References Cited

U.S. PATENT DOCUMENTS

| | | |
|---|---|---|
| 6,376,337 B1 | 4/2002 | Wang et al. |
| 6,472,685 B2 | 10/2002 | Takagi |
| 6,741,624 B2 | 5/2004 | Mears et al. |
| 6,830,964 B1 | 12/2004 | Mears et al. |
| 6,833,294 B1 | 12/2004 | Mears et al. |
| 6,878,576 B1 | 4/2005 | Mears et al. |
| 6,891,188 B2 | 5/2005 | Mears et al. |
| 6,897,472 B2 | 5/2005 | Mears et al. |
| 6,927,413 B2 | 8/2005 | Mears et al. |
| 6,952,018 B2 | 10/2005 | Mears et al. |
| 6,958,486 B2 | 10/2005 | Mears et al. |
| 6,993,222 B2 | 1/2006 | Mears et al. |
| 7,018,900 B2 | 3/2006 | Kreps |
| 7,033,437 B2 | 4/2006 | Mears et al. |
| 7,034,329 B2 | 4/2006 | Mears et al. |
| 7,045,377 B2 | 5/2006 | Mears et al. |
| 7,045,813 B2 | 5/2006 | Mears et al. |
| 7,071,119 B2 | 7/2006 | Mears et al. |
| 7,105,895 B2 | 9/2006 | Wang et al. |
| 7,109,052 B2 | 9/2006 | Mears et al. |
| 7,123,792 B1 | 10/2006 | Mears et al. |
| 7,148,712 B1 | 12/2006 | Prey, Jr. et al. |
| 7,153,763 B2 | 12/2006 | Hytha et al. |
| 7,202,494 B2 | 4/2007 | Blanchard et al. |
| 7,227,174 B2 | 6/2007 | Mears et al. |
| 7,229,902 B2 | 6/2007 | Mears et al. |
| 7,265,002 B2 | 9/2007 | Mears et al. |
| 7,279,699 B2 | 10/2007 | Mears et al. |
| 7,279,701 B2 | 10/2007 | Kreps |
| 7,288,457 B2 | 10/2007 | Kreps |
| 7,303,948 B2 | 12/2007 | Mears et al. |
| 7,432,524 B2 | 10/2008 | Mears et al. |
| 7,435,988 B2 | 10/2008 | Mears et al. |
| 7,436,026 B2 | 10/2008 | Kreps |
| 7,446,002 B2 | 11/2008 | Mears et al. |
| 7,446,334 B2 | 11/2008 | Mears et al. |
| 7,491,587 B2 | 2/2009 | Rao |
| 7,514,328 B2 | 4/2009 | Rao |
| 7,517,702 B2 | 4/2009 | Halilov et al. |
| 7,531,828 B2 | 5/2009 | Mears et al. |
| 7,531,829 B2 | 5/2009 | Blanchard |
| 7,531,850 B2 | 5/2009 | Blanchard |
| 7,586,116 B2 | 9/2009 | Kreps et al. |
| 7,586,165 B2 | 9/2009 | Blanchard |
| 7,598,515 B2 | 10/2009 | Mears et al. |
| 7,612,366 B2 | 11/2009 | Mears et al. |
| 7,625,767 B2 | 12/2009 | Huang et al. |
| 7,659,539 B2 | 2/2010 | Kreps et al. |
| 7,700,447 B2 | 4/2010 | Dukovski et al. |
| 7,718,996 B2 | 5/2010 | Dukovski et al. |
| 7,781,827 B2 | 8/2010 | Rao |
| 7,812,339 B2 | 10/2010 | Mears et al. |
| 7,863,066 B2 | 1/2011 | Mears et al. |
| 7,880,161 B2 | 2/2011 | Mears et al. |
| 7,928,425 B2 | 4/2011 | Rao |
| 8,389,974 B2 | 3/2013 | Mears et al. |
| 9,275,996 B2 | 3/2016 | Mears et al. |
| 9,406,753 B2 | 8/2016 | Mears et al. |
| 9,558,939 B1 | 1/2017 | Stephenson et al. |
| 9,899,479 B2 | 2/2018 | Mears et al. |
| 9,941,359 B2 | 4/2018 | Mears et al. |
| 9,972,685 B2 | 5/2018 | Mears et al. |
| 10,084,045 B2 | 9/2018 | Mears et al. |
| 10,107,854 B2 | 10/2018 | Roy |
| 10,109,342 B2 | 10/2018 | Roy |
| 10,109,479 B1 | 10/2018 | Mears et al. |
| 10,170,560 B2 | 1/2019 | Mears |
| 10,170,603 B2 | 1/2019 | Mears et al. |
| 10,170,604 B2 | 1/2019 | Mears et al. |
| 10,191,105 B2 | 1/2019 | Roy |
| 10,249,745 B2 | 4/2019 | Mears et al. |
| 10,276,625 B1 | 4/2019 | Mears et al. |
| 10,304,881 B1 | 5/2019 | Chen et al. |
| 10,355,151 B2 | 7/2019 | Chen et al. |
| 10,361,243 B2 | 7/2019 | Mears et al. |
| 10,367,028 B2 | 7/2019 | Chen et al. |
| 10,367,064 B2 | 7/2019 | Rao |
| 10,381,242 B2 | 8/2019 | Takeuchi |
| 10,396,223 B2 | 8/2019 | Chen et al. |
| 10,410,880 B2 | 9/2019 | Takeuchi |
| 10,453,945 B2 | 10/2019 | Mears et al. |
| 10,461,118 B2 | 10/2019 | Chen et al. |
| 10,468,245 B2 | 11/2019 | Weeks et al. |
| 10,529,757 B2 | 1/2020 | Chen et al. |
| 10,529,768 B2 | 1/2020 | Chen et al. |
| 10,566,191 B1 | 2/2020 | Weeks et al. |
| 10,580,866 B1 | 3/2020 | Takeuchi et al. |
| 10,580,867 B1 | 3/2020 | Takeuchi et al. |
| 10,593,761 B1 | 3/2020 | Takeuchi et al. |
| 10,608,027 B2 | 3/2020 | Chen et al. |
| 10,608,043 B2 | 3/2020 | Chen et al. |
| 10,615,209 B2 | 4/2020 | Chen et al. |
| 2003/0034529 A1 | 2/2003 | Fitzgerald et al. |
| 2003/0057416 A1 | 3/2003 | Currie et al. |
| 2004/0266045 A1 | 12/2004 | Mears et al. |
| 2005/0272239 A1 | 12/2005 | Hytha et al. |
| 2005/0282330 A1 | 12/2005 | Mears et al. |
| 2006/0220118 A1 | 10/2006 | Stephenson et al. |
| 2006/0267130 A1 | 11/2006 | Rao |
| 2007/0012910 A1 | 1/2007 | Mears et al. |
| 2007/0020833 A1 | 1/2007 | Mears et al. |
| 2007/0020860 A1 | 1/2007 | Mears et al. |
| 2008/0012004 A1 | 1/2008 | Huang et al. |
| 2008/0258134 A1 | 10/2008 | Mears et al. |
| 2011/0215299 A1 | 9/2011 | Rao |
| 2015/0357414 A1 | 12/2015 | Mears |
| 2016/0099317 A1* | 4/2016 | Mears ............... H01L 29/66795 257/19 |
| 2016/0149023 A1 | 5/2016 | Mears et al. |
| 2016/0358773 A1 | 12/2016 | Mears et al. |
| 2018/0358361 A1 | 12/2018 | Rao |
| 2019/0057896 A1 | 2/2019 | Stephenson et al. |
| 2019/0058059 A1 | 2/2019 | Stephenson et al. |
| 2019/0189652 A1 | 6/2019 | Chen et al. |
| 2019/0279869 A1 | 9/2019 | Weeks et al. |
| 2019/0279897 A1 | 9/2019 | Stephenson et al. |
| 2019/0280090 A1 | 9/2019 | Stephenson et al. |
| 2019/0317277 A1 | 10/2019 | Stephenson |
| 2019/0319135 A1 | 10/2019 | Stephenson |
| 2019/0319136 A1 | 10/2019 | Stephenson |
| 2019/0319167 A1 | 10/2019 | Stephenson |
| 2020/0075731 A1 | 3/2020 | Weeks et al. |

OTHER PUBLICATIONS

U.S. Appl. No. 16/176,005, filed Oct. 31, 2018 Weeks et al.
U.S. Appl. No. 16/192,897, filed Nov. 16, 2018 Connelly et al.
U.S. Appl. No. 16/192,911, filed Nov. 16, 2018 Teakeuchi et al.
U.S. Appl. No. 16/192,923, filed Nov. 16, 2018 Takeuchi et al.
U.S. Appl. No. 16/192,987, filed Nov. 16, 2018 Takeuchi et al.
U.S. Appl. No. 16/193,000, filed Nov. 16, 2018 Takeuchi et al.
U.S. Appl. No. 16/193,011, filed Nov. 16, 2018 Takeuchi et al.
U.S. Appl. No. 16/513,528, filed 17/17/2019; Burton et al.
U.S. Appl. No. 16/513,832; filed 17/17/2019 Burton et al.
U.S. Appl. No. 16/513,845, filed 17/17/2019 Burton et al.
U.S. Appl. No. 16/513,875; filed 17/17/2019 Burton et al.
U.S. Appl. No. 16/513,895; filed 17/17/2019 BURTON et al.
U.S. Appl. No. 16/513,906; filed 17/17/2019 Burton et al.
U.S. Appl. No. 16/513,932; filed 17/17/2019 Burton et al.
U.S. Appl. No. 16/513,943, Filed 17/17/2019 Burton et al.
U.S. Appl. No. 16/801,305, filed Feb. 26, 2020 Weeks et al.
Luo et al., "Chemical Design of Direct-Gap Light-Emitting Silicon" published in Physical Review Letters, vol. 89, No. 7; Aug. 12, 2002; 4 pgs.
Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.
Novikov et al. "Silicon-based Optoelectronics" 1999-2003, pp. 1-6.
R. Tsu "Phenomena in silicon nanostructure device" published online Sep. 6, 2000 by Applied Physics and Materials Science & Processing, pp. 391-402.

(56) References Cited

OTHER PUBLICATIONS

R. Tsu "Si Based Green ELD: Si-Oxygen Superlattice" wysiwyg://l/http://www3.interscience.wiley.com/cgi-bin/abstract/72512946/start: published online Jul. 21, 2000; 2 pgs. Abstract Only.
Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016.
Xu et al. "Extension of planar bulk n-channel MOSFET scaling with oxygen insertion technology" IEEE Transactions on Electron devices, vol. 61, No. 9; Sep. 2014. pp. 3345-3349.
Xu et al., "MOSFET performance and scalability enhancement by insertion of oxygen layers", Department of Electrical Engineering and Computer Science, University of California, Berkeley, 2012, pp. 1-4.
Weeks et al., U.S. Appl. No. 16/801,305, filed Feb. 26, 2020, Office Action dated Feb. 24, 2021, pp. 1-27.

* cited by examiner

METHOD FOR MAKING SEMICONDUCTOR DEVICE INCLUDING A SUPERLATTICE WITH DIFFERENT NON-SEMICONDUCTOR MATERIAL MONOLAYERS

TECHNICAL FIELD

The present disclosure generally relates to semiconductor devices and, more particularly, to semiconductor devices with enhanced semiconductor materials and related methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an re-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

U.S. Pat. No. 7,105,895 to Wang et al. discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A method for making a semiconductor device may include forming a superlattice on a semiconductor substrate and including a plurality of stacked groups of layers. Each group of layers of the superlattice may include a plurality of stacked base semiconductor monolayers defining a base semiconductor portion and at least one non-semiconductor monolayer constrained within a crystal lattice of adjacent base semiconductor portions. A first at least one non-semiconductor monolayer may be constrained within the crystal lattice of a first pair of adjacent base semiconductor portions and comprise a first non-semiconductor material, and a second at least one non-semiconductor monolayer may be constrained within the crystal lattice of a second pair of adjacent base semiconductor portions and comprise a second non-semiconductor material different than the first non-semiconductor material.

By way of example, the first non-semiconductor material may comprise oxygen and nitrogen, and the second non-semiconductor material may comprise at least one of carbon and oxygen. In one example embodiment, a third at least one non-semiconductor monolayer may be constrained within the crystal lattice of a third pair of adjacent base semiconductor portions comprising a third non-semiconductor material different than the first and second non-semiconductor materials.

In an example implementation, the first non-semiconductor material may comprise nitrogen, and the first at least one non-semiconductor monolayer may be above the second at least one non-semiconductor monolayer in the superlattice. In accordance with another example, a base semiconductor portion between the first at least one non-semiconductor monolayer and the second at least one non-semiconductor monolayer may comprise a carbon dopant. The base semiconductor monolayers may comprise silicon, for example. In an example embodiment, the method may further include forming spaced apart source and drain regions defining a channel within the superlattice, and a gate overlying the channel.

DETAILED DESCRIPTION

Figure 1:
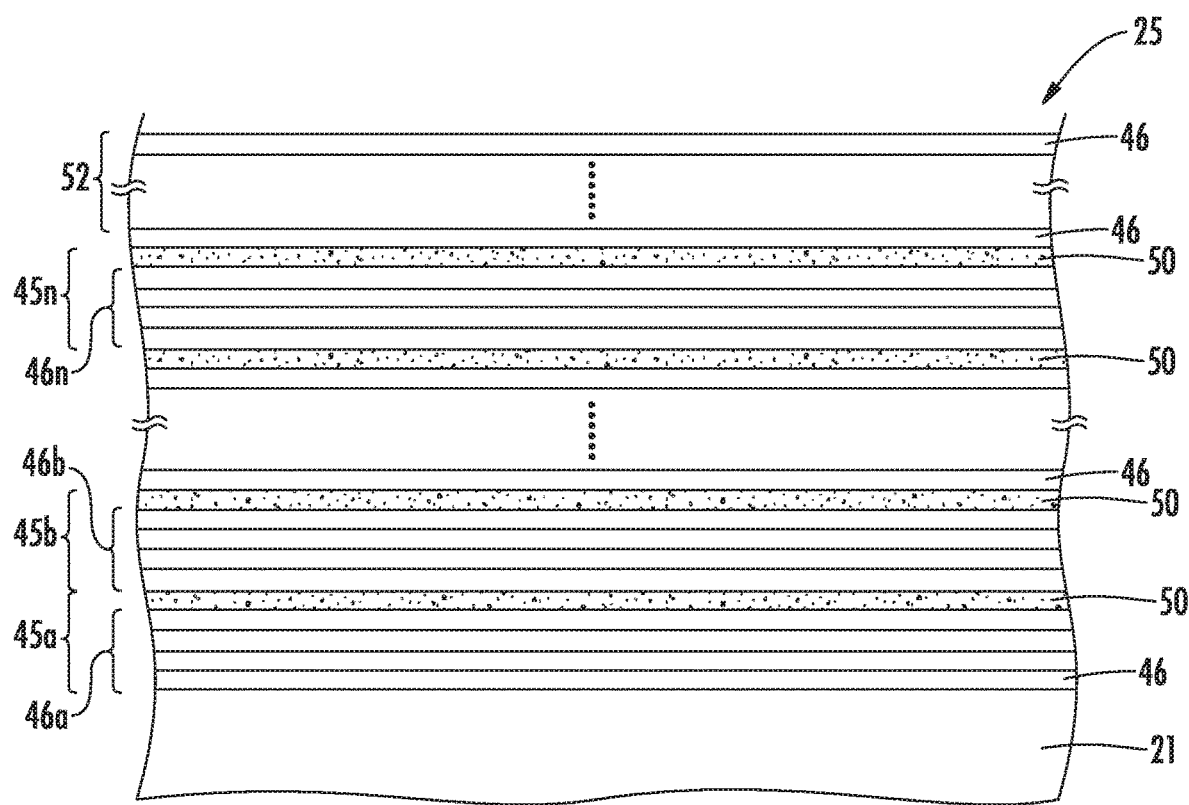
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime and multiple prime notation are used to indicate similar elements in different embodiments.

Generally speaking, the present disclosure relates to utilizing enhanced superlattice materials within source and drain regions to reduce Schottky barrier height and thereby decrease source and drain contact resistance. The enhanced semiconductor superlattice is also referred to as an "MST" layer or "MST technology" in this disclosure and the accompanying drawings.

More particularly, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) =$$

$$\frac{-\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again, Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
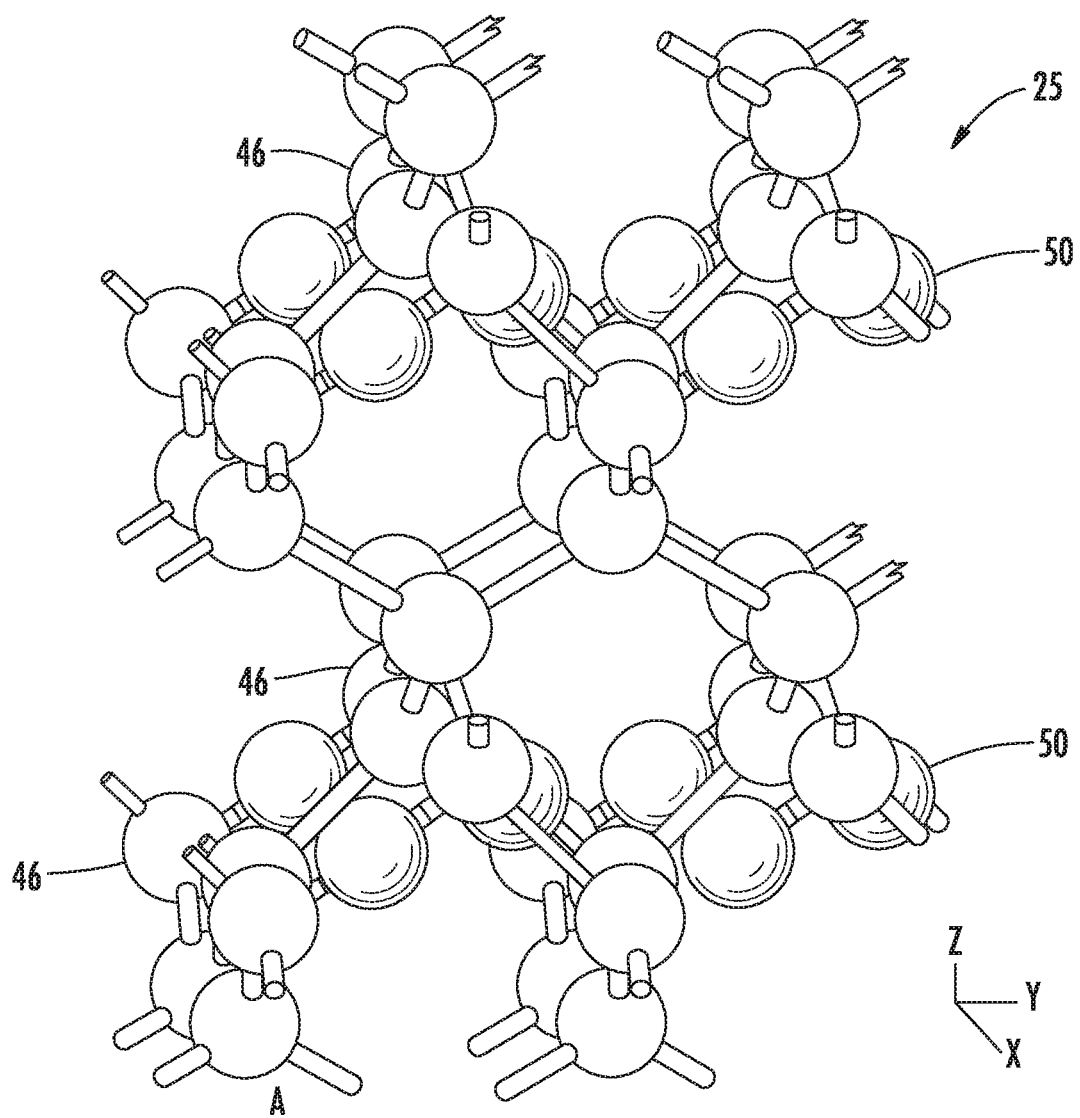
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed, it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
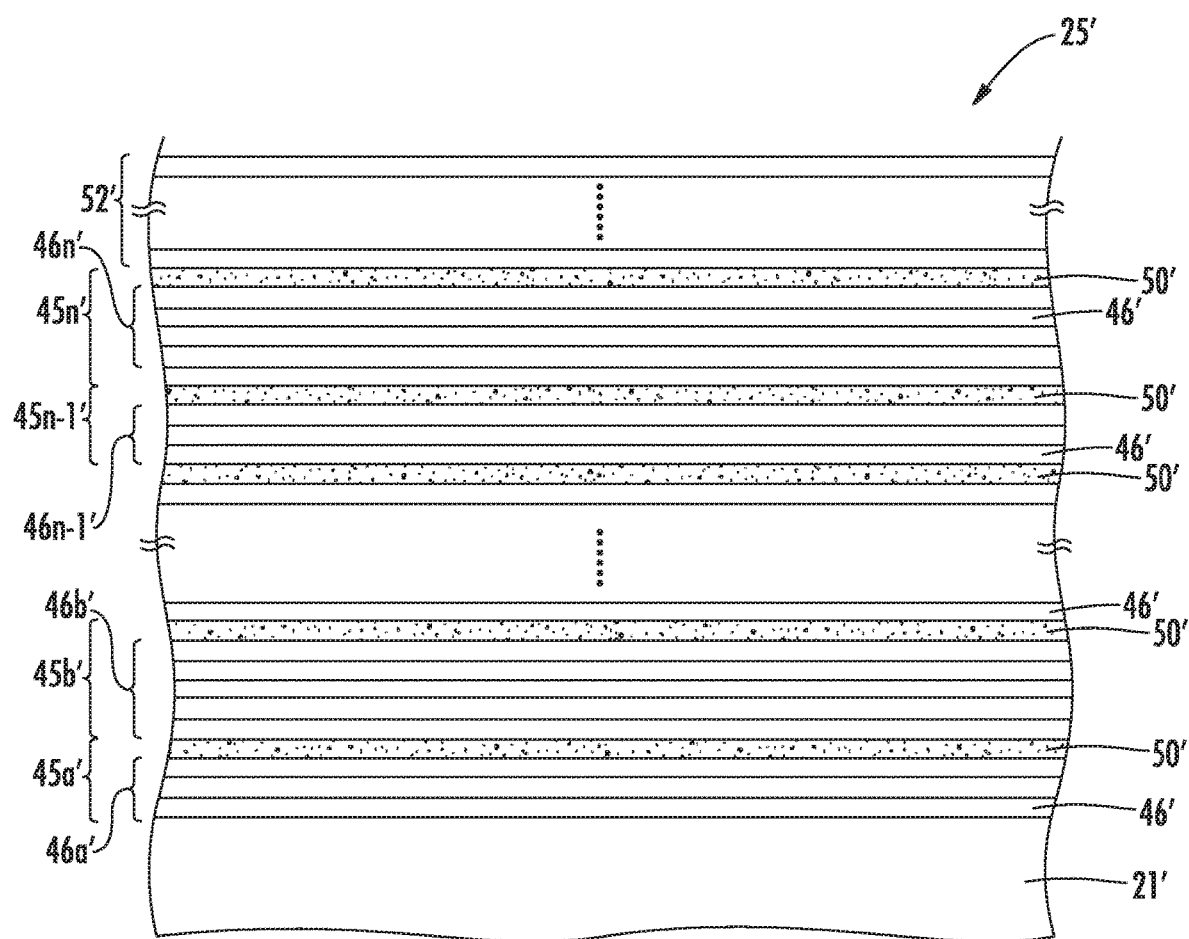
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
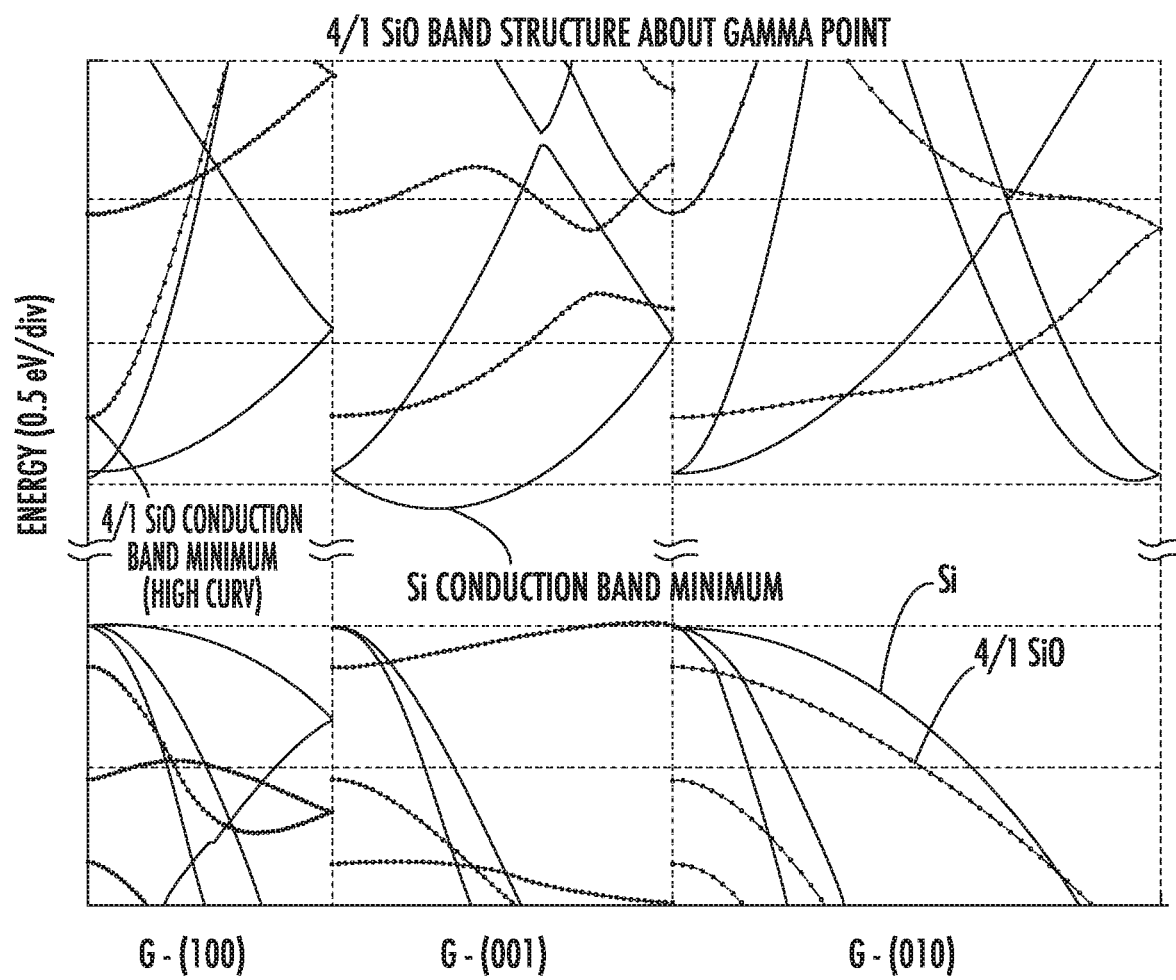
FIG. 4A is a graph of the calculated band structure from the gamma point (G) for both bulk silicon as in the prior art, and for the 4/1 Si/O superlattice as shown in FIGS. 1-2.
Figure 4B:
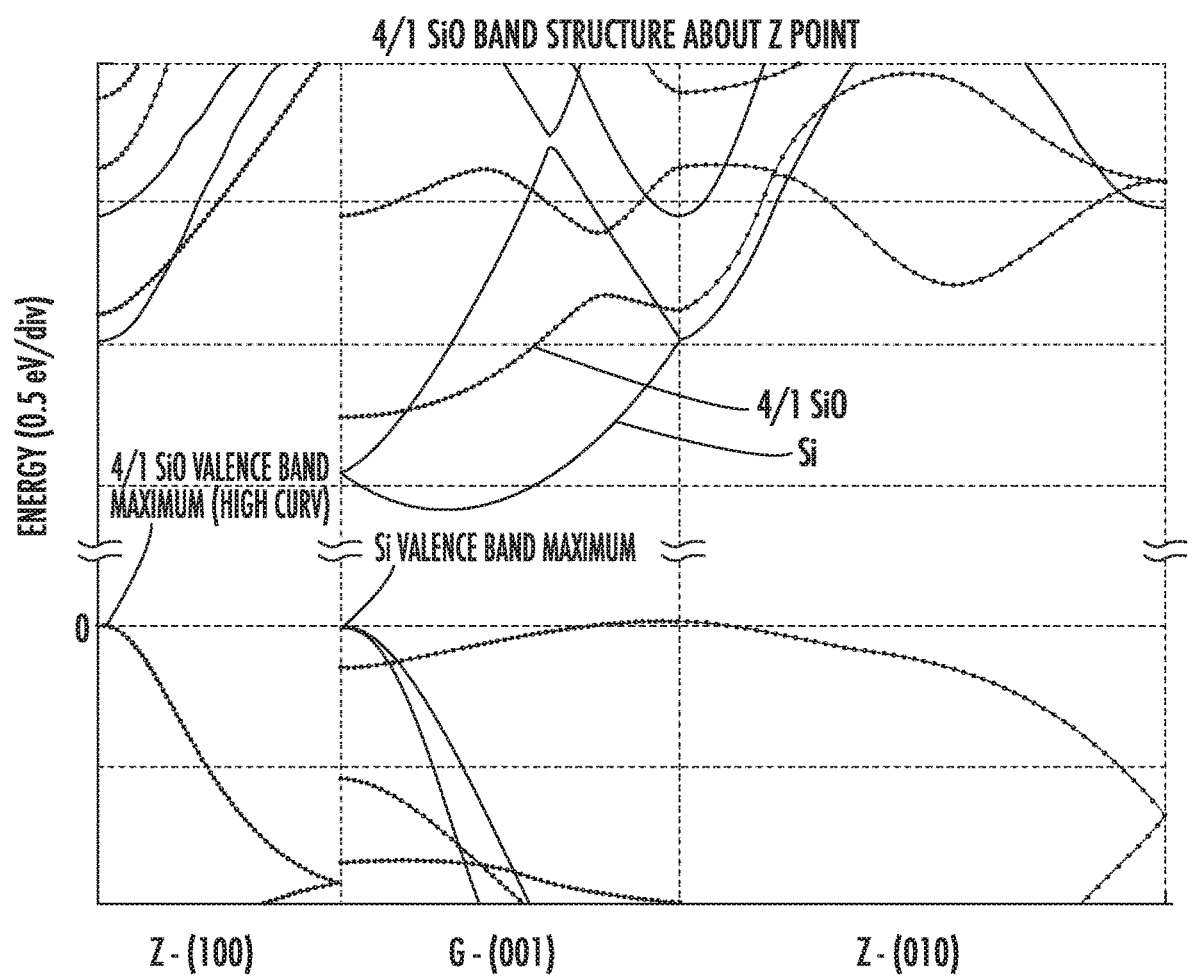
FIG. 4B is a graph of the calculated band structure from the Z point for both bulk silicon as in the prior art, and for the 4/1 Si/O superlattice as shown in FIGS. 1-2.
Figure 4C:
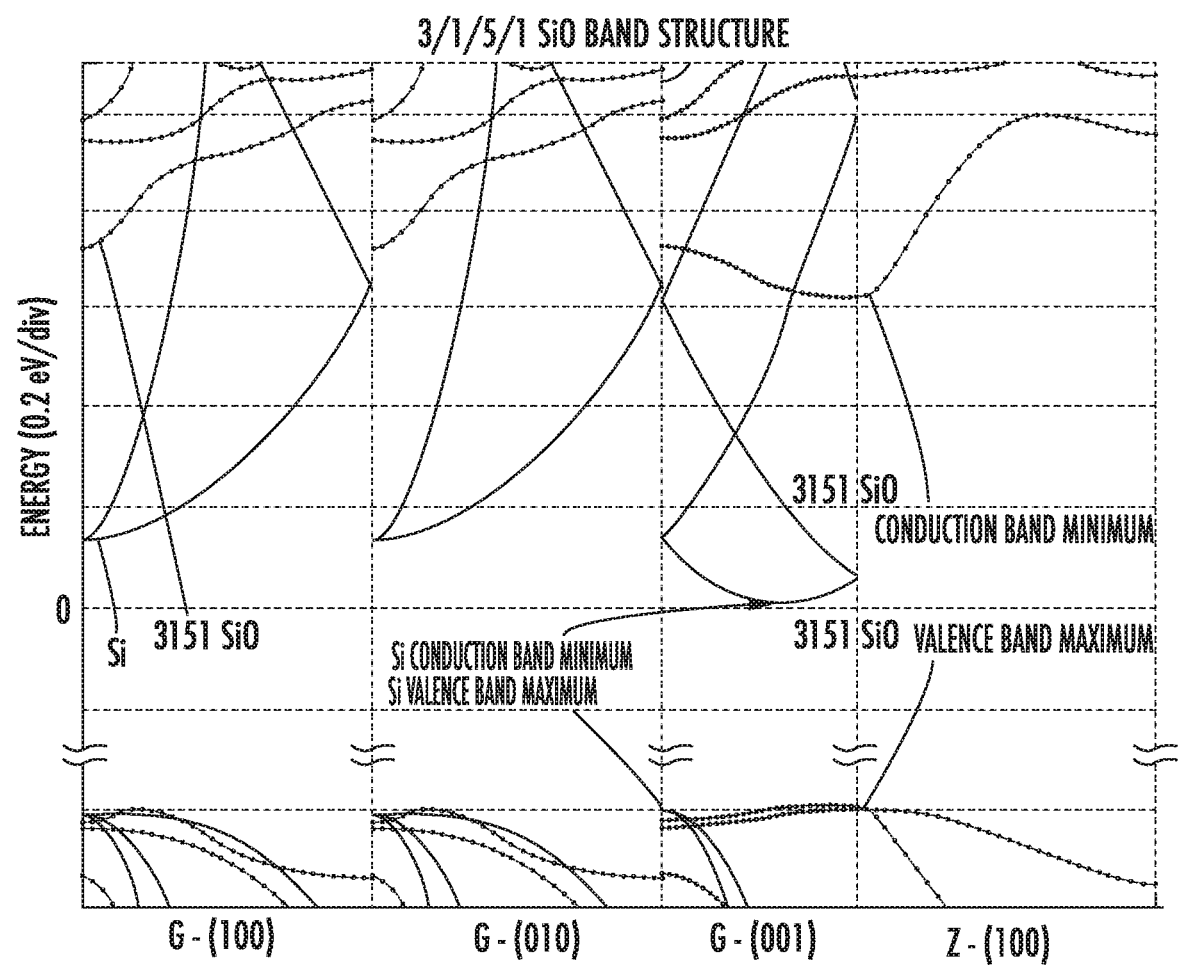
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However, the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus, the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Turning to FIGS. 5-9, other example superlattice structures are now described which incorporate different types of non-semiconductor materials in different non-semiconductor monolayers 50. By way of background, co-pending U.S. application Ser. No. 16/176,005 to Weeks et al. (which is assigned to the present Applicant and is hereby incorporated herein in its entirety by reference) teaches an approach for using the above-described MST material as a nitrogen gettering layer. By diffusing nitrogen into the MST film monolayers after epitaxial deposition, this allows for a greater final dosage of nitrogen to boost dopant blocking and mobility enhancement, for example.

While this approach is accordingly advantageous in numerous applications, one characteristic of this approach is that the nitrogen infused into the MST gettering layer may penetrate all of the non-semiconductor monolayers 50, which in the case of an Si/O superlattice would mean that each of the non-semiconductor monolayers would include both oxygen and nitrogen. In some instances, it may be desirable to not only getter nitrogen within the superlattice 25, but also to confine it to certain portions or regions of the superlattice. This may be done, for example, by introducing another non-semiconductor material such as carbon to one or more non-semiconductor monolayers 50 or base silicon portion 46a-46n below the region where the nitrogen is to be confined.

Figure 5:
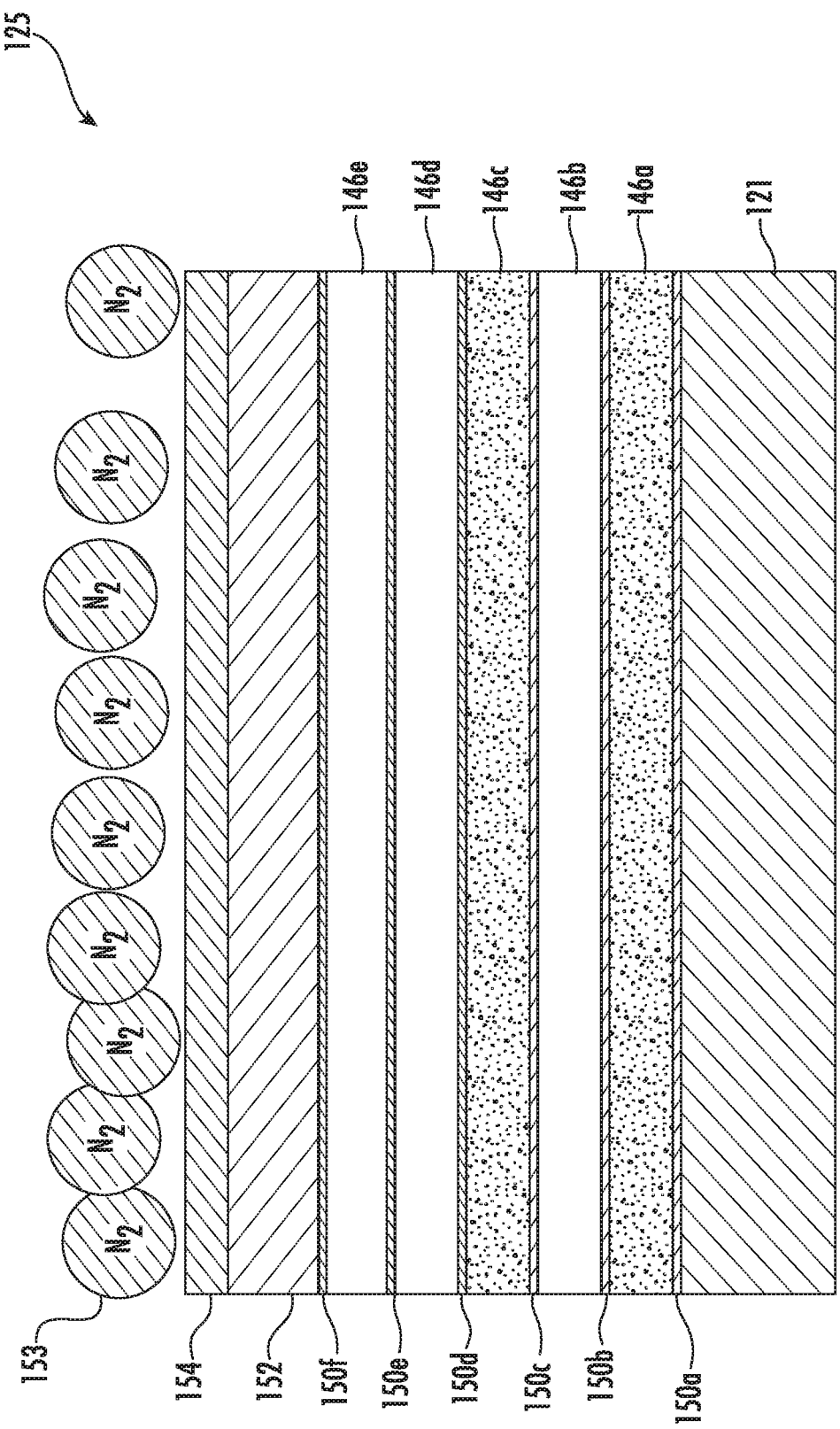
FIGS. 5-9 are schematic cross-sectional diagrams of different example embodiments of superlattices having different non-semiconductor material layers therein.

More particularly, in the example shown in FIG. 5, a superlattice 125 is formed on a semiconductor (e.g., silicon) substrate 121 (which may be patterned or unpatterned), and the superlattice illustratively includes in stacked order an oxygen monolayer(s) 150a, a base silicon portion 146a including a carbon dopant, another oxygen monolayer(s) 150b, a base silicon portion 146b without a carbon dopant, another oxygen monolayer(s) 150c, and another base silicon portion 146c including a carbon dopant. The carbon in the base silicon portion 146c advantageously helps block or shield nitrogen 53 from diffusing down into the monolayers 150a-150c.

More particularly, during the anneal in $N_2$, the nitrogen 153 is blocked from the lower oxygen monolayers 150a-

150c by the carbon in the base silicon portions 146c. This results in most or all of the nitrogen being trapped in the upper MST spacers and inserted MST oxygen layers. The total absorbed nitrogen will be equal to the total amount that would have been evenly distributed over the full superlattice 125 stack without the carbon shielding.

As such, the next three non-semiconductor monolayers 150d-150f in the stack (which have base silicon portions 146d and 146e therebetween) include oxygen and nitrogen. A silicon cap layer 152 is formed on the upper non-semiconductor layer 150f, and is terminated in a nitride (SiN) layer 154. The illustrated example includes six non-semiconductor monolayers 150a-150f (with three above the final carbon-infused silicon base portion 146c), in which the carbon also helps stabilize/block the oxygen from being lost, although different numbers of semiconductor base portions and non-semiconductor monolayers may be used in different embodiments.

For greater nitrogen enhancement, in some embodiments a greater number of oxygen monolayers may be included bellow the carbon. The result would be that the total nitrogen 153' drawn from the surface would all pile up in the top most oxygen monolayers above the carbon. This could be used to form a silicon oxynitride layer or greater quantum mechanical manipulation, depending on the degree of nitrogen 153' piled up in the upper carbon-free base silicon portions, as will be appreciated by those skilled in the art.

Figure 6:
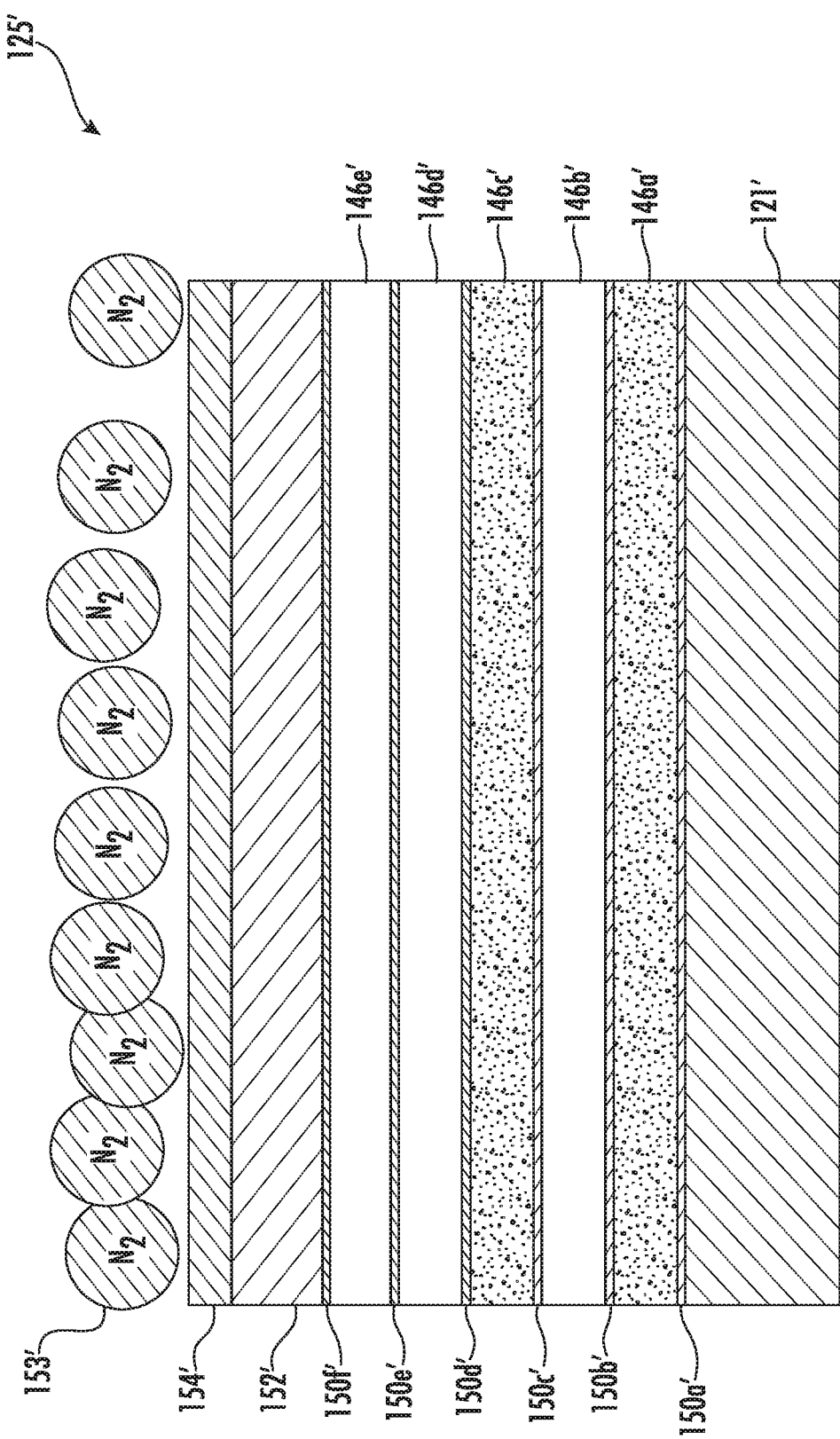

Referring additionally to the superlattice 125' of FIG. 6, a similar configuration is shown in which all three lower silicon base portions 146a'-146c' include carbon. The upper silicon base portions 146d'-146e' are without carbon, and the oxygen monolayers 150d'-150f' will receive the full absorbed nitrogen 153' dose. Surface nitrogen 153' sees the full potential of all the oxygen in the entire superlattice 125' stack, but is blocked from the lower oxygen monolayers 150a'-150c' by the carbon in the silicon base portions 146a'-146c'. In another example embodiment, just the base silicon portions 146c' may include carbon (i.e., and not the base silicon portions 146a'-146b'), if desired.

Figure 7:
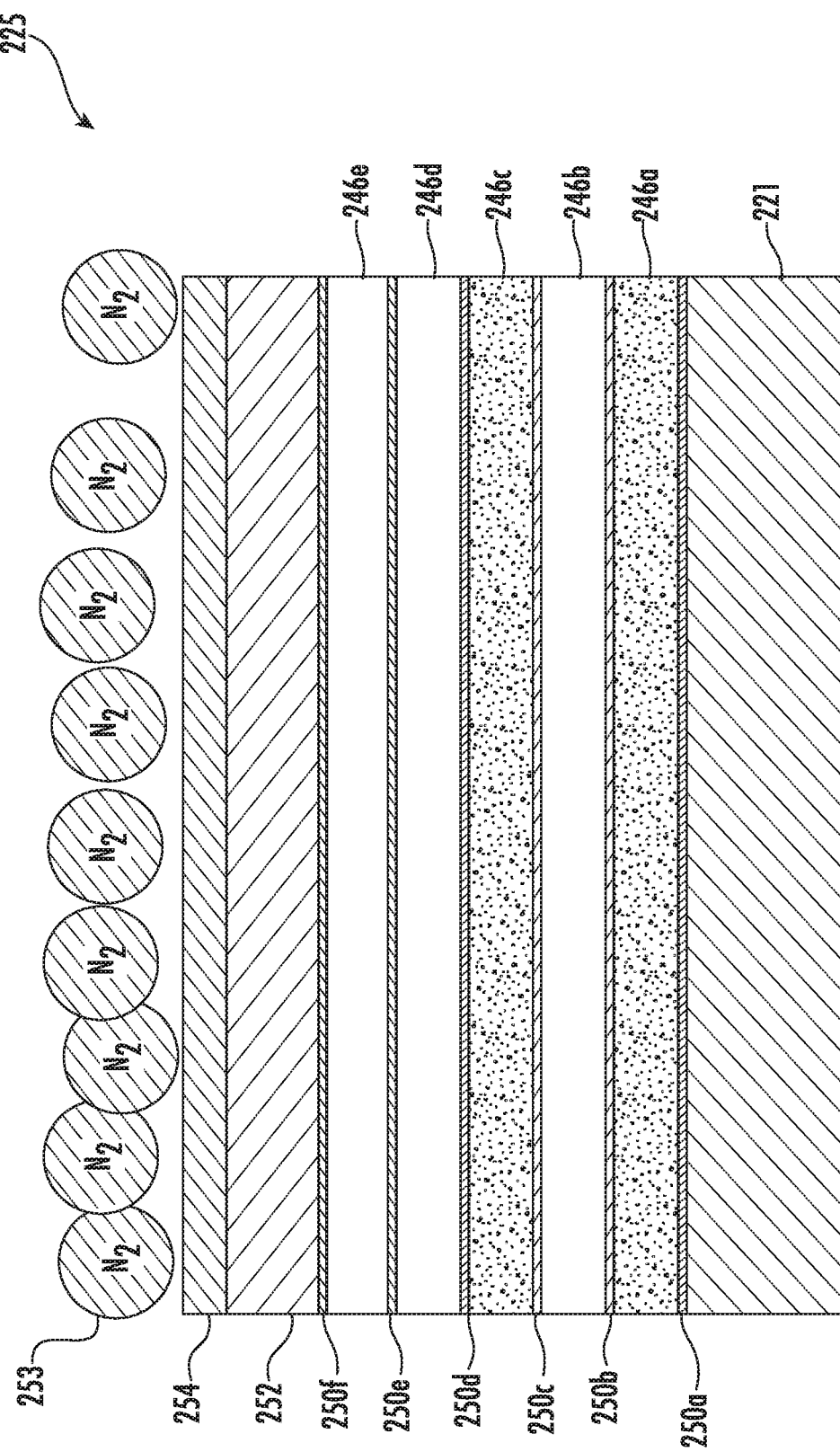

Still another example embodiment of a superlattice 225 is now described with reference to FIG. 7, which includes a substrate 221, non-semiconductor (e.g., oxygen) monolayers 250a-250f, base semiconductor (e.g., silicon) portions 246a-246e, a semiconductor (e.g., silicon) cap layer 252, and nitride (e.g., SiN) layer 254, similar to the embodiments discussed above. However, in the illustrated configuration, none of the silicon base portions 246a-246e includes a carbon dopant. Instead, a carbon source gas is dosed during the oxygen monolayer 250c insertion step so that this monolayer(s) includes both carbon and oxygen atoms.

Figure 8:
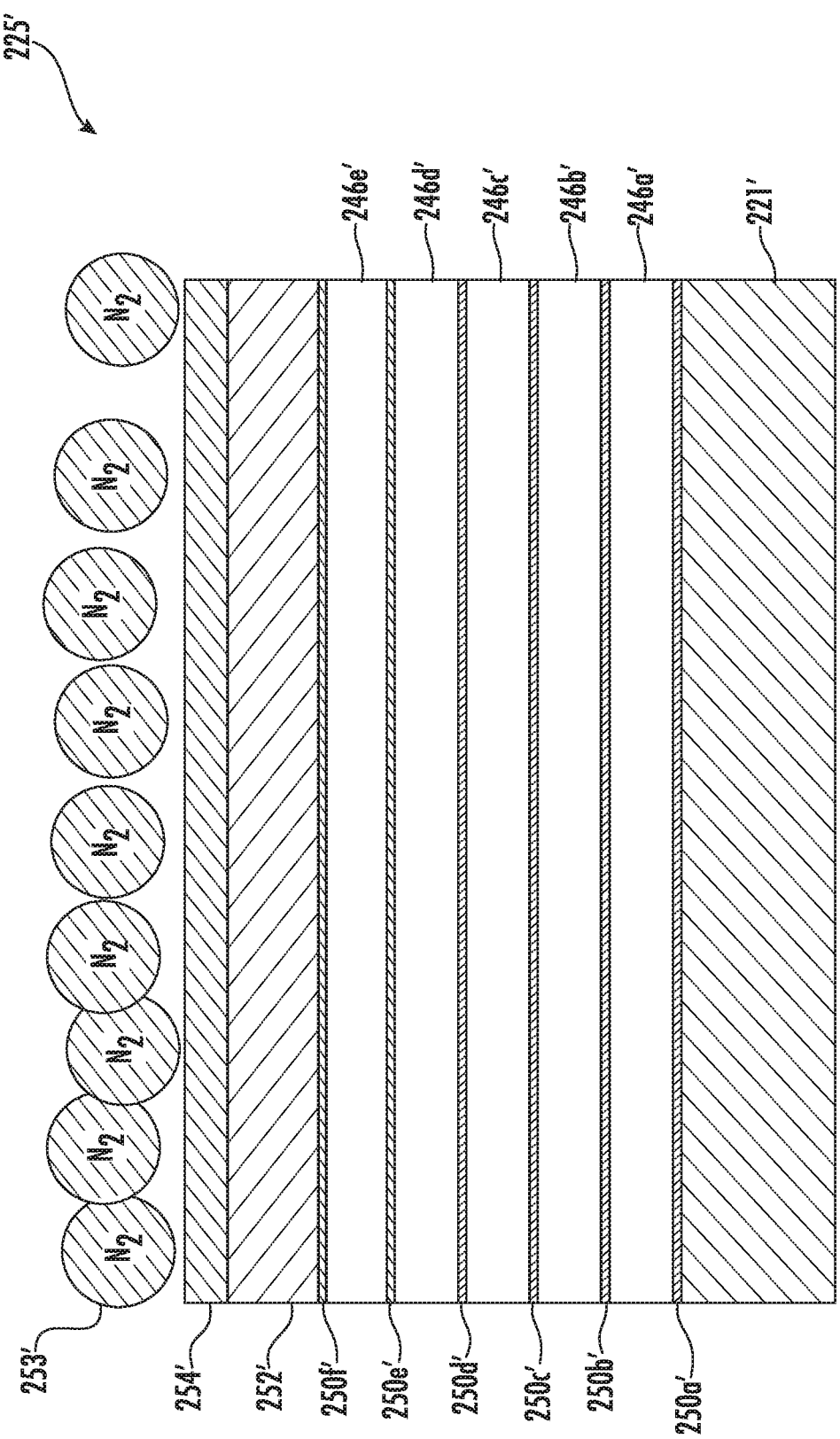

It should be noted that carbon may be co-dosed, dosed after the oxygen, or before the oxygen in different embodiments. Thus, in the present example, the carbon used to block the nitrogen 253 from diffusing into the lower oxygen monolayers 250a, 250b resides with the oxygen in the monolayer(s) 250c instead of with any of the silicon base portions 246a-246e. The present example illustrates just the middle oxygen monolayer(s) 250c having carbon, but in different embodiments other oxygen monolayers may have carbon as well to provide for even greater confinement of the nitrogen 253 to the upper two oxygen monolayers 250e, 250f and base silicon portions 246d, 246e. That is, all or substantially all of the dose of nitrogen 253 that would have otherwise been distributed over the six oxygen monolayers 250a-250f may instead be confined to the upper two oxygen monolayers 250e, 250f. One such example superlattice 225' is illustrated in FIG. 8, in which all three of the bottom oxygen monolayers 250a'-250c' have carbon atoms inserted therein.

Figure 9:
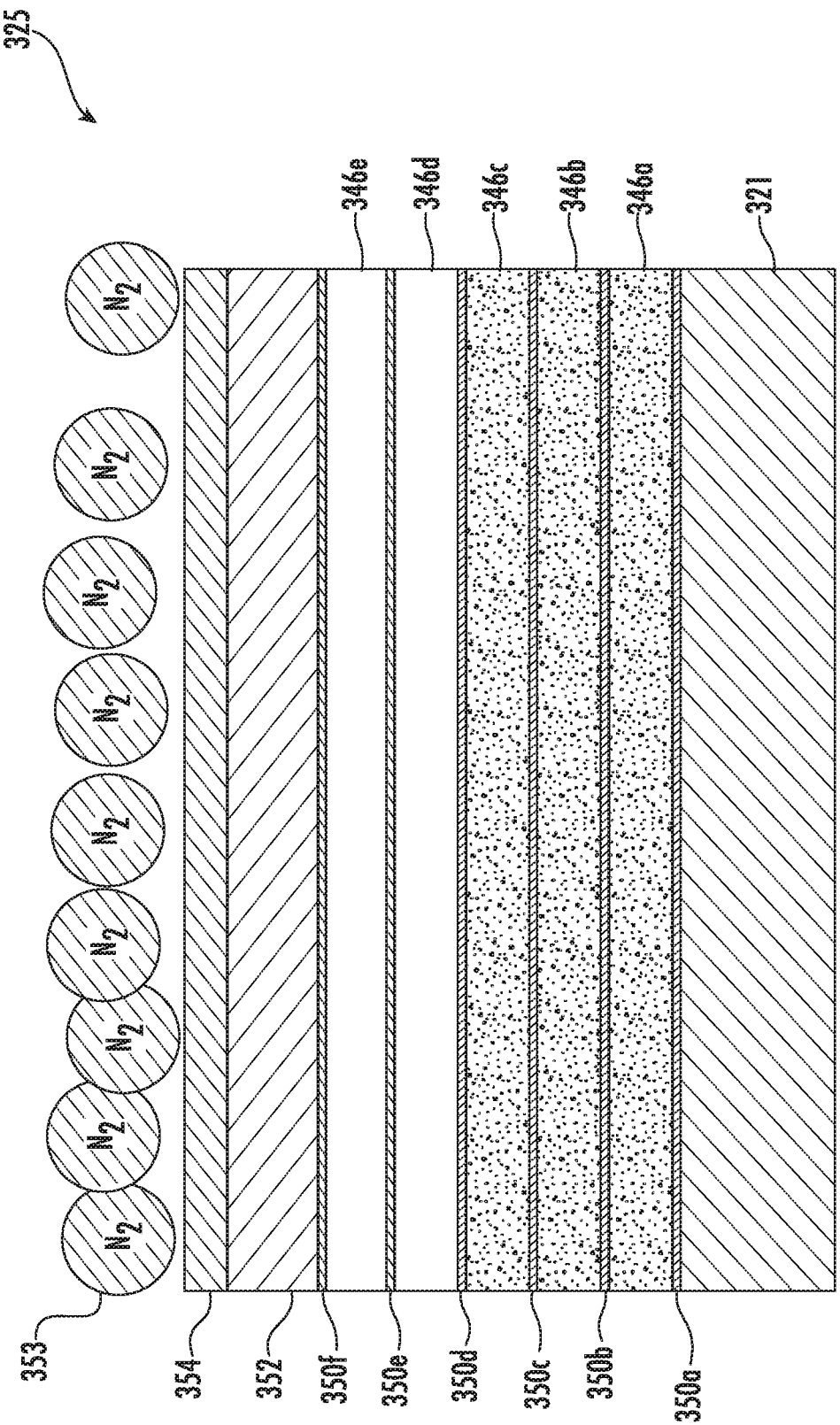

In still another example embodiment of the superlattice 325 illustrated in FIG. 9, carbon may be inserted in both base silicon portions as well as oxygen monolayers. In the illustrated example, the superlattice 325 includes a substrate 321, non-semiconductor (e.g., oxygen) monolayers 350a-350f, base semiconductor (e.g., silicon) portions 346a-346e, a semiconductor (e.g., silicon) cap layer 352, and nitride (e.g., SiN) layer 354, similar to the embodiments discussed above. However, all of the lower oxygen monolayers 350a-350d and base silicon portions 346a-346c have carbon added for greater confinement of the nitrogen 353 to the upper two oxygen monolayers 350e, 350f and base silicon layers 346d, 346e.

Figure 10:
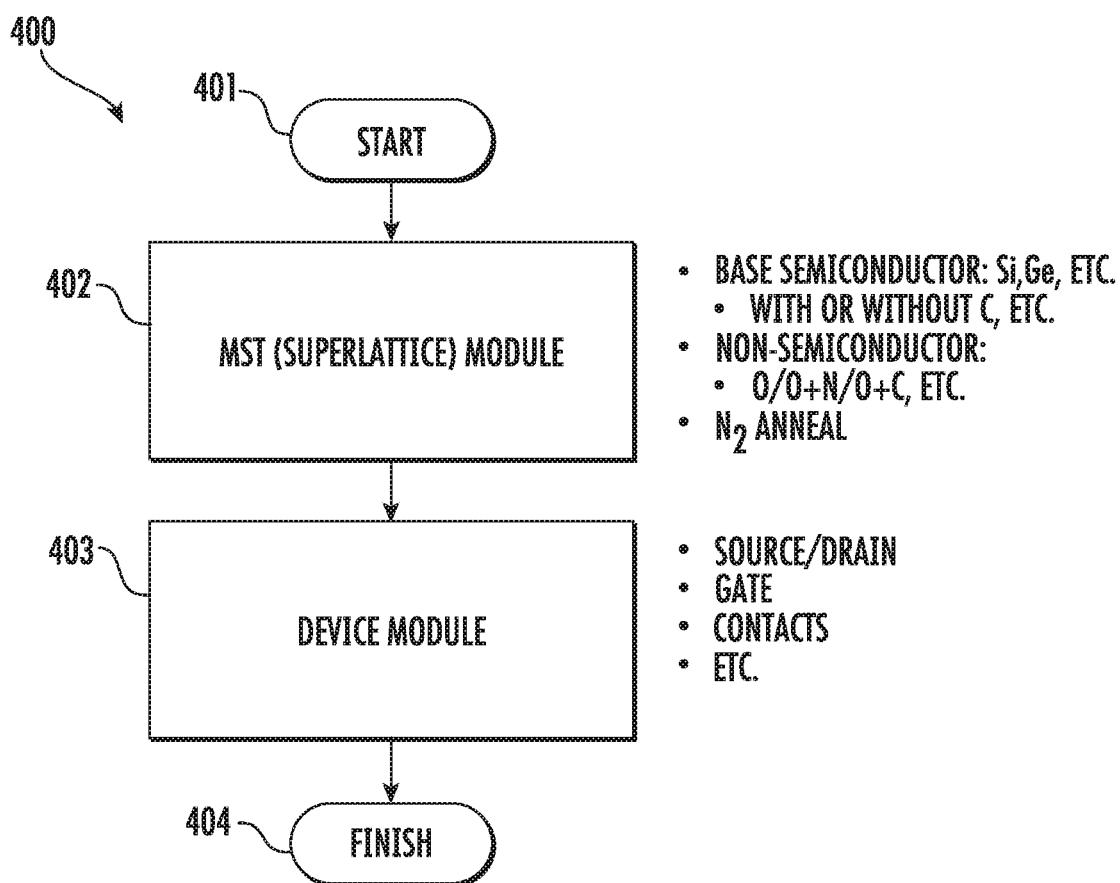
FIG. 10 is a flow diagram illustrating a method of making a semiconductor device including any of the superlattices of FIGS. 5-9 in accordance with an example embodiment.
Figure 11:
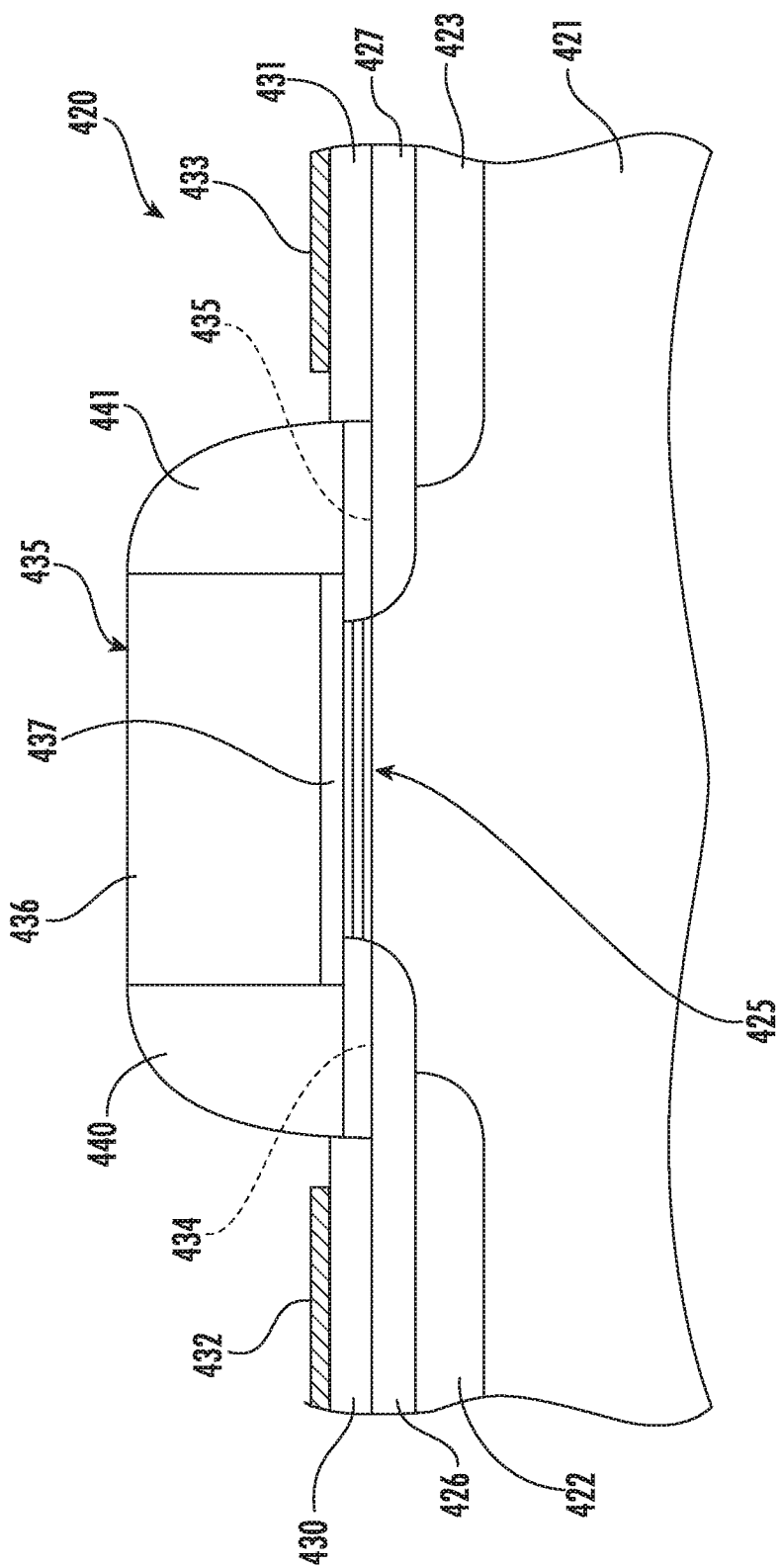
FIG. 11 is a schematic cross-sectional diagram of an example semiconductor device which may be fabricated in accordance with the method of FIG. 10.

Turning to the flow diagram 400 of FIG. 10 and FIG. 11, an example method for making a semiconductor device 420 including a superlattice 425 as set forth above is now described. Beginning at Block 401, an MST superlattice module may be performed (Block 402) to form the basic MST structure on a semiconductor substrate 421 with a blocking material (such as carbon) implanted or deposited within one or more of the base semiconductor (e.g., silicon) portions and/or the non-semiconductor (e.g., oxygen) monolayers, as discussed above. If the carbon is added during oxygen monolayer insertion, it may be on the order of a 1E15 atoms/cm$^2$ dose per insert (or less), and more particularly around 2.5E14 atoms/cm$^2$ per insert, for example.

If the carbon is added during formation of the base semiconductor portions, then the concentration may be between 0.01 to 10 atomic percent, and more particularly between 0.1 and 2 atomic percent carbon in each base silicon portion, for example. The carbon source gas may be added with the silicon precursors during the chemical vapor deposition process of the base silicon layers. Example gaseous carbon sources include propene (propylene $C_3H_6$), cyclopropane ($C_3H_6$), and methyl-silane ($SiH_3CH_3$), for example. Another approach is to implant carbon into just the lower base silicon portions, and have the upper base silicon portions without the carbon dose.

As noted above, after formation of the superlattice structure in the MST module 402, additional processing steps may be performed during a device module 403 to create the semiconductor device 420, which in the present example is a planar MOSFET. One skilled in the art, however, will appreciate that the materials and techniques identified herein may be used in many different types of semiconductor devices, such as discrete devices and/or integrated circuits. The illustrated MOSFET 420 includes the substrate 421, source/drain regions 422, 423, source/drain extensions 426, 427, and a channel region therebetween provided by the superlattice 425. Source/drain silicide layers 430, 431 and source/drain contacts 432, 433 overlie the source/drain regions, as will be appreciated by those skilled in the art. Regions indicated by dashed lines 434, 435 are optional vestigial portions formed originally with the superlattice 425, but thereafter heavily doped. In other embodiments, these vestigial superlattice regions 434, 435 may not be present as will also be appreciated by those skilled in the art. A gate 435 illustratively includes a gate insulating layer 437 adjacent the channel provided by the superlattice 425, and a gate electrode layer 436 on the gate insulating layer. Sidewall spacers 440, 441 are also provided in the illustrated MOSFET 420.

The above-described techniques accordingly allow for the isolation of some of the base semiconductor layers and non-semiconductor monolayers closest to the substrate from the nitrogen that the oxygen is attracting from the surface, during a $N_2$ anneal using carbon, either in the oxygen monolayers and/or the base silicon portions. On the other hand, annealing of a hydrogen terminated MST superlattice without carbon in a nitrogen environment results in uniformly distributed nitrogen throughout the entire MST stack.

In other words, the present approach utilizes carbon for blocking/isolating some or all of the nitrogen dose to the upper unblocked inserted oxygen monolayers. This may advantageously increase the total nitrogen content in the upper unblocked superlattice layers. For example, it has been demonstrated that a seven-layer MST superlattice stack with 1.58E15 atoms/cm$^2$ creates enough of a driving force to attract 0.5E15 atoms/cm$^2$ nitrogen during a 900° C. $N_2$ anneal. By adding carbon in some of the lower oxygen monolayers and/or base silicon portions, Applicant theorizes without wishing to be bound thereto that the nitrogen being absorbed during the $N_2$ annealing process will see the full attractive force from all the oxygen in the full set of seven monolayers/base silicon portions, but the nitrogen will be confined to the upper MST layers without carbon, due to the carbon blocking atoms in the lower MST layers. For the seven-layer example, if the lower four oxygen monolayers and/or base silicon portions are carbon doped, then the nitrogen will be confined to the upper three oxygen monolayers and/or base silicon portions, which would result in their receiving the total dose that would have otherwise been distributed over the entire seven layers.

With respect to mobility enhancement (e.g., in the channel of a MOSFET transistor), the localized enhancement may be greater due to the nitrogen right near the surface being higher. For silicon-on-isolator (SOI) applications, a goal may be to have enough layers of the MST superlattice with carbon below a few layers of the MST superlattice without carbon such that the layers without carbon could become insulating due to the enhanced nitrogen content.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor device comprising:
    forming a superlattice on a semiconductor substrate and comprising a plurality of stacked groups of layers, with each group of layers of the superlattice comprising a plurality of stacked base semiconductor monolayers defining a base semiconductor portion and at least one non-semiconductor monolayer constrained within a crystal lattice of adjacent base semiconductor portions;
    wherein a first at least one non-semiconductor monolayer constrained within the crystal lattice of a first pair of adjacent base semiconductor portions comprises a first non-semiconductor material, and wherein a second at least one non-semiconductor monolayer constrained within the crystal lattice of a second pair of adjacent base semiconductor portions comprises a second non-semiconductor material different than the first non-semiconductor material; and
    wherein at least one base semiconductor portion comprises a carbon dopant distributed throughout the at least one base semiconductor portion.

2. The method of claim 1 wherein the first non-semiconductor material comprises oxygen and nitrogen.

3. The method of claim 1 wherein the second non-semiconductor material comprises at least one of carbon and oxygen.

4. The method of claim 1 wherein a third at least one non-semiconductor monolayer constrained within the crystal lattice of a third pair of adjacent base semiconductor portions comprises a third non-semiconductor material different than the first and second non-semiconductor materials.

5. The method of claim 1 wherein the first non-semiconductor material comprises nitrogen, and wherein the first at least one non-semiconductor monolayer is above the second at least one non-semiconductor monolayer in the superlattice.

6. The method of claim 1 wherein the at least one base silicon portion comprising the carbon dopant distributed throughout the at least one base semiconductor portion is between the first at least one non-semiconductor monolayer and the second at least one non-semiconductor monolayer.

7. The method of claim 1 wherein the base semiconductor monolayers comprise silicon.

8. The method of claim 1 further comprising forming spaced apart source and drain regions defining a channel within the superlattice, and a gate overlying the channel.

9. A method for making a semiconductor device comprising:
    forming a superlattice on a semiconductor substrate and comprising a plurality of stacked groups of layers, with each group of layers of the superlattice comprising a plurality of stacked base silicon monolayers defining a base silicon portion and at least one non-semiconductor monolayer constrained within a crystal lattice of adjacent base silicon portions;
    wherein a first at least one non-semiconductor monolayer constrained within the crystal lattice of a first pair of adjacent base silicon portions comprises a first non-semiconductor material, wherein a second at least one non-semiconductor monolayer constrained within the crystal lattice of a second pair of adjacent base silicon portions comprises a second non-semiconductor material different than the first non-semiconductor material, and wherein the first non-semiconductor material comprises oxygen and nitrogen; and
    wherein at least one base silicon portion comprises a carbon dopant distributed throughout the at least one base semiconductor portion.

10. The method of claim 9 wherein the second non-semiconductor material comprises at least one of carbon and oxygen.

11. The method of claim 9 wherein a third at least one non-semiconductor monolayer constrained within the crystal lattice of a third pair of adjacent base silicon portions comprises a third non-semiconductor material different than the first and second non-semiconductor materials.

12. The method of claim 9 wherein the first at least one non-semiconductor monolayer is above the second at least one non-semiconductor monolayer in the superlattice.

13. The method of claim 9 wherein the at least one base silicon portion comprising the carbon dopant distributed throughout the at least one base semiconductor portion is between the first at least one non-semiconductor monolayer and the second at least one non-semiconductor monolayer.

14. A method for making a semiconductor device comprising:

forming a superlattice on a semiconductor substrate and comprising a plurality of stacked groups of layers, with each group of layers of the superlattice comprising a plurality of stacked base silicon monolayers defining a base silicon portion and at least one non-semiconductor monolayer constrained within a crystal lattice of adjacent base silicon portions;

wherein a first at least one non-semiconductor monolayer constrained within the crystal lattice of a first pair of adjacent base silicon portions comprises a first non-semiconductor material, wherein a second at least one non-semiconductor monolayer constrained within the crystal lattice of a second pair of adjacent base silicon portions comprises a second non-semiconductor material different than the first non-semiconductor material, and wherein the second non-semiconductor material comprises at least one of oxygen and carbon; and wherein at least one base silicon portion comprises a carbon dopant distributed throughout the at least one base semiconductor portion.

15. The method of claim 14 wherein a third at least one non-semiconductor monolayer constrained within the crystal lattice of a third pair of adjacent base silicon portions comprises a third non-semiconductor material different than the first and second non-semiconductor materials.

16. The method of claim 14 wherein the first at least one non-semiconductor monolayer is above the second at least one non-semiconductor monolayer in the superlattice.

17. The method of claim 14 wherein the at least one base silicon portion comprising the carbon dopant distributed throughout the at least one base semiconductor portion is between the first at least one non-semiconductor monolayer and the second at least one non-semiconductor monolayer.

18. A method for making a semiconductor device comprising:

forming a superlattice on the semiconductor substrate and comprising a plurality of stacked groups of layers, with each group of layers of the superlattice comprising a plurality of stacked base semiconductor monolayers defining a base semiconductor portion and at least one non-semiconductor monolayer constrained within a crystal lattice of adjacent base semiconductor portions;

wherein a first at least one non-semiconductor monolayer constrained within the crystal lattice of a first pair of adjacent base semiconductor portions comprises a first non-semiconductor material, a second at least one non-semiconductor monolayer constrained within the crystal lattice of a second pair of adjacent base semiconductor portions comprises a second non-semiconductor material different than the first non-semiconductor material, the first non-semiconductor material comprising oxygen and nitrogen, and the second non-semiconductor material comprising at least one of carbon and oxygen;

wherein a base semiconductor portion between the first at least one non-semiconductor monolayer and the second at least one non-semiconductor monolayer comprises a carbon dopant distributed throughout the base semiconductor portion.

19. The method of claim 18 wherein a third at least one non-semiconductor monolayer constrained within the crystal lattice of a third pair of adjacent base semiconductor portions comprises a third non-semiconductor material different than the first and second non-semiconductor materials.

20. The method of claim 18 wherein the first at least one non-semiconductor monolayer is above the second at least one non-semiconductor monolayer in the superlattice.

21. The method of claim 18 wherein the base semiconductor monolayers comprise silicon.

* * * * *